United States Patent
Sakamoto et al.

(10) Patent No.: US 9,904,166 B2
(45) Date of Patent: Feb. 27, 2018

(54) GREEN PIGMENT COMPOSITION FOR COLOR FILTERS, AND COLOR FILTER

(71) Applicant: DIC Corporation, Tokyo (JP)

(72) Inventors: Keisuke Sakamoto, Sakura (JP); Akira Kimura, Sakura (JP); Katsunori Shimada, Sakura (JP)

(73) Assignee: DIC CORPORATION, Tokyo (JP)

( * ) Notice: Subject to any disclaimer, the term of this patent is extended or adjusted under 35 U.S.C. 154(b) by 0 days.

(21) Appl. No.: 15/512,952

(22) PCT Filed: Feb. 16, 2016

(86) PCT No.: PCT/JP2016/054400
§ 371 (c)(1),
(2) Date: Mar. 21, 2017

(87) PCT Pub. No.: WO2016/170828
PCT Pub. Date: Oct. 27, 2016

(65) Prior Publication Data
US 2017/0299961 A1    Oct. 19, 2017

(30) Foreign Application Priority Data
Apr. 21, 2015 (JP) .................. 2015-086767

(51) Int. Cl.
*G02B 5/20* (2006.01)
*G03F 7/00* (2006.01)
*G03F 7/004* (2006.01)
*C09B 47/10* (2006.01)
*C09B 47/16* (2006.01)
*G02B 5/22* (2006.01)

(52) U.S. Cl.
CPC ............ *G03F 7/0007* (2013.01); *C09B 47/10* (2013.01); *C09B 47/16* (2013.01); *G02B 5/20* (2013.01); *G02B 5/223* (2013.01); *G03F 7/004* (2013.01)

(58) Field of Classification Search
CPC ....... G03F 7/0007; G02B 5/223; C09B 47/10; C09B 47/16
USPC .............................................. 430/7; 349/106
See application file for complete search history.

(56) References Cited

U.S. PATENT DOCUMENTS

| 2006/0098316 | A1* | 5/2006 | Tatsuzawa | G02F 1/133516 359/891 |
| 2014/0150692 | A1* | 6/2014 | Tsuchiya | C09B 47/16 106/287.18 |
| 2016/0327710 | A1* | 11/2016 | Murakami | G02B 5/201 |

* cited by examiner

*Primary Examiner* — John A McPherson
(74) *Attorney, Agent, or Firm* — Westerman, Hattori, Daniels & Adrian, LLP

(57) ABSTRACT

Provided is a green pigment composition which includes a halogenated zinc phthalocyanine pigment and a brominated chlorinated zinc phthalocyanine derivative having a phthalimide skeleton bonded by an alkylene group, and which enables a great enhancement in contrast without decreasing luminance and coloring power, and a color filter including the green pigment composition. The green pigment composition for color filters includes from 0.1 to 10 parts of a halogenated zinc phthalocyanine pigment derivative substituted with a functional group having a phthalimide skeleton bonded by an alkylene group per 100 parts of a halogenated zinc phthalocyanine pigment, in terms of a mass, and a color filter includes the green pigment composition for color filters.

5 Claims, No Drawings

GREEN PIGMENT COMPOSITION FOR COLOR FILTERS, AND COLOR FILTER

TECHNICAL FIELD

The present invention relates to a green pigment composition for color filters, and a color filter.

BACKGROUND ART

A color filter used for a liquid crystal display is a member which allows only the light of a necessary wavelength region to transmit the color filter from white light of the back light passing through the color filter by disposing a plurality of colors regularly on a transparent glass substrate to realize a color display of the display. The color used for the color filter generally includes three primary colors such as red, green, and blue, and for adjusting each transmission spectrum, improvement of a color material, a resin used an additive, or the like, which is used, has been conducted repeatedly. Among these, from a viewpoint of enhancing display quality, an increase in luminance and expansion of a color reproducibility range have been demanded to a green coloring agent for color filters.

In order to increase luminance, it is important to select a pigment having high transmittance with respect to back light, and the luminance has been improved by using the pigment green 58 as a major pigment instead of the conventional pigment green 36. Also, as the luminance has been increased due to the improvement of the pigment, white light of the back light can be used effectively and accordingly, energy or the manufacturing cost of the display can be decreased.

For the expansion of the color reproducibility range, it is necessary to increase chroma of the color material included in a color filter. In order to produce a coating film with high chroma, a method for increasing a pigment concentration in the coating film or a method of increasing the thickness of the coating film with the same pigment concentration is exemplified. However, it is difficult to secure every resistance of the coating film in any cases, and accordingly the pigment green 7 has been selected as a major pigment, which enables a decrease in the film thickness in a specific chromaticity after mixing with a yellow color material, rather than the pigment green 36 or the pigment green 58 which has been used for the conventional color filter. An expansion of the color reproducibility range can be possible due to the increase in film thickness using the pigment, green 36 or the pigment green 58, but it is not possible to achieve 90% or more of the NTSC ratio with a practical film thickness, which is the reason why the pigment green 7 is selected. For example, it is suggested to form a green pixel using a green photosensitive resin composition containing the pigment green 7 and the pigment yellow 185 to achieve high color reproducibility with a thin film having a thickness of 2.2 μm or less. However, since the pigment green 7 has low transmittance compared to the pigment green 36 and the pigment green 58, there is a problem in that luminance of the obtained display is decreased. Furthermore, an increase of the light intensity of the back light may compensate for luminance, but a new problem occurs such as an increase in electric power consumption and accordingly an improvement is demanded. As described above, a color material for color filters satisfying both luminance and color reproducibility is demanded.

In order to solve this problem, it is suggested to use a dye compound as a color material for color filters in order to increase luminance. The dye compound often is a dye having fluorescent light and it is suggested to provide a color filter having high luminance and a high contrast ratio by suppressing fluorescence of the dye having fluorescent light. In order to suppress the fluorescence and improve dispersibility, an addition of a pigment derivative having a substituent introduced into various pigment skeletons has been suggested (PTL 1).

Similarly, as a coloring composition for color filters having an excellent contrast ratio of color filters, dispersion stability, and chemical resistance, a coloring composition for color filters including a phthalocyanine pigment having a pigment and a substituent has been suggested (PTL 2).

Also, for a color filter having high color reproducibility, the use of a pigment such as the pigment green 7 and the pigment green 58 has been suggested, but sufficient luminance is not obtained and there is a problem in that the thickness of a color filter becomes large in the production of the film (PTL 3).

In order to form a color filter having increased luminance and expanded color reproducibility range, these conventional technologies are insufficient and the objective has not been achieved yet.

CITATION LIST

Patent Literature

PTL 1: JP-A-2013-101166

PTL 2: JP-A-2014-206700

PTL 3: JP-A-2013-205581

SUMMARY OF INVENTION

Technical Problem

The present invention provides a green pigment composition which includes a halogenated zinc phthalocyanine pigment and a brominated chlorinated zinc phthalocyanine derivative having a phthalimide skeleton bonded by an alkylene group, and which enables a great enhancement in contrast without decreasing luminance and coloring power, and a color filter including the green pigment composition.

Solution to Problem

A pigment composition for color filters according to the present invention includes 0.1 to 10 parts of a pigment derivative represented by General Formula (1) per 100 parts of a halogenated zinc phthalocyanine pigment, in terms of a mass.

[Chem. 1]

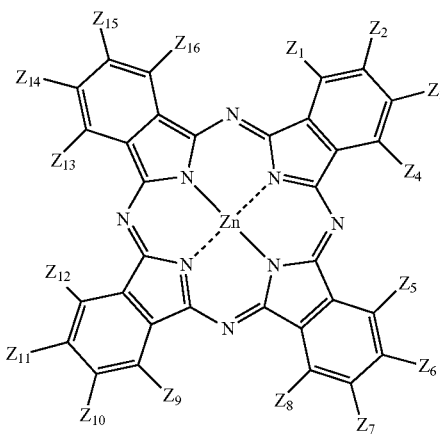

(1)

In General Formula (1), $Z_1$ to $Z_{16}$ each independently represent a bromine atom, a chlorine atom, a hydrogen atom, or a functional group having a phthalimide skeleton bonded by an alkylene group having 1 to 3 carbon atoms, an average number of bromine atoms in one molecule is 8 to 12, an average number of chlorine atoms is 2 to 5, an average number of substituents of the functional group having a phthalimide skeleton bonded by an alkylene group having 1 to 3 carbon atoms is 0.1 to 3, and the remainder is hydrogen atoms.

In the green pigment composition for color filters, the halogenated zinc phthalocyanine pigment has 10 to 14 halogen atoms on average in one molecule, and among these, the number of bromine atoms is 8 to 12 on average, and the number of chlorine atoms is 2 to 5 on average.

The green pigment composition for color filters further includes a yellow pigment.

A color filter includes the pigment composition for color filters.

A method for manufacturing the pigment composition for color filters by solvent salt milling is provided.

Advantageous Effects of Invention

By using a pigment composition including a halogenated zinc phthalocyanine pigment and a pigment derivative having a functional group with a phthalimide skeleton bonded by an alkylene group having 1 to 3 carbon atoms in a halogenated zinc phthalocyanine pigment in which the number of halogen atoms in one molecule is 10 to 14 on average, and among these, the number of bromine atoms is 8 to 12 on average, and the number of chlorine atoms is 2 to 5 on average, the present invention can provide a color filter which enables a great enhancement in contrast without decreasing luminance and coloring power.

DESCRIPTION OF EMBODIMENTS

In the present invention, it is determined that by using a pigment composition including a halogenated zinc phthalocyanine pigment and a halogenated zinc phthalocyanine pigment derivative having a phthalimide skeleton, a color filter can be produced, which enables a great enhancement in contrast without decreasing luminance and coloring power.

The halogenated zinc phthalocyanine pigment is a compound including a zinc metal disposed in the center and a phthalocyanine ring which is substituted with at least one halogen atom selected from chlorine, bromine, fluorine, and iodine, and may be substituted with a substituent other than halogen, and the total number of each substituent is 16 in maximum. At the position which has not been substituted with halogen or a substituent other than halogen, a hydrogen atom presents.

In the present invention, the halogenated zinc phthalocyanine pigment is halogenated zinc phthalocyanine whose average particle diameter of primary particles is 0.01 to 0.30 μm, which is a general pigment particle diameter in order to achieve luminance and a contrast ratio which are optical properties desired for the application of a color filter.

The average particle diameter of the primary particle of the present invention is a value determined by photographing particles within a visual field using a transmission electron microscope JEM-2010 (manufactured by JOEL Ltd.) and obtaining each diameter of the longer side (major axis) of 50 primary particles of the halogenated zinc phthalocyanine pigment configuring an aggregate on a two-dimensional image to average the diameters. At that time, the sample halogenated zinc phthalocyanine pigment is photographed by a microscope after the pigment is ultra-sonic dispersed in a solvent. In addition, a scanning electron microscope may be used instead of the transmission electron microscope.

Since a halogenated zinc phthalocyanine pigment derivative whose number of halogenation is adjusted and a color phase is adjusted by introducing a phthalimide skeleton bonded by a bulky alkylene group is used, the green pigment composition for color filters of the present invention does not have a yellowish color phase as the conventional green pigment having a high number of halogenation but has a bluish color phase, which is unique. As the pigment composition of the present invention is included in a color filter, a color phase which could not be achieved in the conventional high-halogenated zinc phthalocyanine pigment can be expressed, and since luminance is high and further a coloring power is high, a decrease in film thickness can be achieved when the pigment is made into a color filter. On the other hand, if the bluish halogenated zinc phthalocyanine pigment composition is mixed with a yellow pigment composition, a green pixel cannot be formed rather than the halogenated zinc phthalocyanine pigment composition of the present invention, and accordingly the bluish halogenated zinc phthalocyanine pigment composition is not suitable for a pigment composition for color filters. In addition, it has been suggested to use a green photosensitive resin composition containing the pigment green 7, which is a bluish color phase, and the pigment yellow 185 to form a green pixel in order to achieve high color reproducibility with a thin film of 2.2 μm or less. However, when compared with the pigment green 36 or the pigment green 58, there is a problem in that transmittance is low and luminance of the display to be obtained is decreased. An increase of the light intensity of the back light may compensate for luminance but a new problem occurs such as an increase in electric power consumption and accordingly an improvement is demanded.

The halogenated zinc phthalocyanine pigment composition used in the present invention can be manufactured from a halogenated zinc phthalocyanine pigment. This halogenated zinc phthalocyanine pigment can be manufactured, for example, by conventionally known manufacturing methods such as a chlorosulfonic acid method, halogenated phthalonitrile method, and a melting method.

As the chlorosulfonic acid method, a method of dissolving zinc: phthalocyanine in a sulfur oxide-based solvent such as a chlorosulfonic acid and putting a chlorine gas and bromine therein to perform halogenation is exemplified. At this time, the reaction is performed in the temperature range of 20° C. to 120° C. for 3 to 20 hours.

As the halogenated phthalonitrile method, for example, a method of appropriately using phthalic acid or phthalodinitrile, in which a part or all of the hydrogen atoms in the aromatic ring has been substituted with a halogen atom such as chlorine and fluorine in addition to bromine, and a metal or metal salts of zinc as starting materials to synthesize a corresponding halogenated zinc phthalocyanine pigment is exemplified. In this case, a catalyst such as ammonium molybdate may be used if necessary. At this time, the reaction is performed in the temperature range of 100° C. to 300° C. for 7 to 35 hours.

As the melting method, a method is exemplified, in which zinc phthalocyanine is halogenated by a halogenating agent, in a molten material having a temperature of 10° C. to 170° C. and including one or more mixtures of a compound which becomes a solvent at the time of various halogenations, in which the compound includes halogenated aluminum such as aluminum chloride and aluminum bromide, halogenated titanium such as titanium tetrachloride, alkali metal halides or alkaline earth metal halides (hereinafter, referred to as alkaline (earth) metal halides) such as sodium chloride and sodium bromide, and thionyl chloride.

Preferred halogenated aluminum is aluminum chloride. The addition amount of the halogenated aluminum in the aforementioned method using the halogenated aluminum is normally 3 times or more moles and preferably 10 to 20 times moles with respect to zinc phthalocyanine.

The halogenated aluminum may be used alone but if the alkaline (earth) metal halide is used in combination with the halogenated aluminum, a melting temperature can be further decreased, which is advantageous for operation. Preferred alkaline (earth) metal halide is sodium chloride. The amount of the alkaline (earth) metal halide to be added is preferably 5 to 15 parts by mass with respect to 10 parts by mass of the halogenated aluminum, which is within the range of generating molten salts.

In addition, examples of the halogenating agent include a chlorine gas, sulfuryl chloride, and bromine.

The halogenation temperature is preferably 10° C. to 170° C. and more preferably 30° C. to 150° C. Furthermore, pressurization is possible to make the reaction rate fast. The reaction time is 5 to 100 hours and preferably 30 to 45 hours.

In the melting method in which two or more of the compounds are used in combination, by adjusting the proportion of chloride, bromide, and iodide in molten salts or changing the introduction amount or the reaction time of a chlorine gas, bromine, or iodine, the content ratio of the halogenated zinc phthalocyanine pigment with a specific halogen atom composition in the generated halogenated zinc phthalocyanine pigment can be arbitrarily controlled, which is preferable.

Metal phthalocyanine which is a preferred raw material in the present invention is zinc phthalocyanine. Since a small amount of the raw material is decomposed during the reaction, the yield from the raw material is more excellent, and the reaction can be conducted using an inexpensive device without using a strong acid, the melting method is preferred in order to obtain the halogenated zinc phthalocyanine pigment.

In the present invention, by optimizing the method of preparing the raw material, the type or the use amount of the catalyst, the reaction temperature, or the reaction time, it is possible to obtain the halogenated zinc phthalocyanine pigment with a halogen atom composition different from the conventionally known halogenated zinc phthalocyanine pigment.

In any of the aforementioned manufacturing methods, if an obtained mixture is put into water or an acidic aqueous solution such as a hydrochloric acid after the reaction is completed, the generated halogenated zinc phthalocyanine pigment is precipitated. This halogenated zinc phthalocyanine pigment may be used as it is; however, thereafter, it is preferable to filter and wash the pigment with water or sodium hydrogensulfate water, sodium hydrogencarbonate water, or sodium hydroxide water, and if necessary, wash the pigment with an organic solvent such as acetone, toluene, methyl alcohol, ethyl alcohol, and dimethyl formamide and be subjected to a post treatment such as drying for the use.

Next, the pigment derivative of the present invention is a pigment derivative represented by General Formula (1).

[Chem. 2]

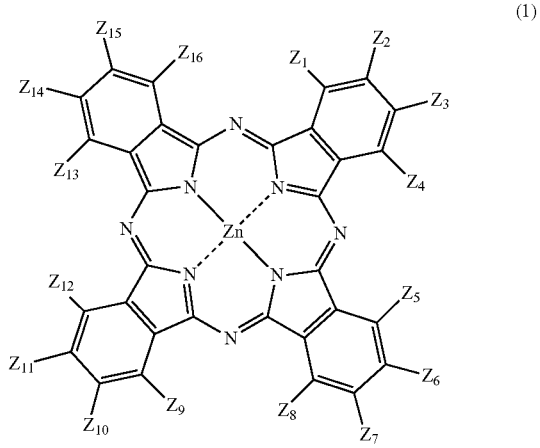

(1)

In General Formula (1), $Z_1$ to $Z_{16}$ each independently represent a bromine atom, a chlorine atom, a hydrogen atom, or a functional group having a phthalimide skeleton bonded by an alkylene group having 1 to 3 carbon atoms, an average number of bromine atoms in one molecule is 8 to 12, an average number of chlorine atoms is 2 to 5, an average number of substituents of the functional group having a phthalimide skeleton bonded by an alkylene group having 1 to 3 carbon atoms is 0.1 to 3, and the remainder is hydrogen atoms.

The halogenated zinc phthalocyanine pigment derivative having a phthalimide skeleton bonded by an alkylene group represented by General Formula (1) shown above is obtained by dissolving a phthalocyanine compound disclosed in JP-A-2-255863 in a sulfuric acid and adding phthalimide and paraformaldehyde thereto to conduct a reaction at a temperature of 80° C., and has a bromine atom, a chlorine atom, a hydrogen atom, or a phthalimide skeleton bonded by an alkylene group in the phthalocyanine skeleton. The average number of substituents of the functional group having at least a phthalimide skeleton bonded by an alkylene group is 0.1 to 3. The pigment derivative contains the bromine atom and the chlorine atom in a specific proportion. More specifically, it is the halogenated zinc phthalocyanine pigment in which the number of bromine atoms in one molecule is 8 to 12 on average, and the number of chlorine atoms is 2 to 5 on average. In order to exhibit high color reproducibility, it is more preferable that the number of halogen atoms in one molecule is 11 to 13 on average, and among these, the number of bromine atoms is 8 to 11 on average, and the number of chlorine atoms is 2 to 3 on average. As the alkylene group, a linking group having 1 to 3 carbon atoms is preferable, and among these, a compound having a methylene group having 1 carbon atom as a linking group is more preferable from a viewpoint of suppressing pigment aggregation effectively.

The number of substituents of the phthalimide group having an alkylene group can be 1 to 6 (because the lowest number of halogens is 10). If the number of carbon atoms is 4 or more, it is considered that the alkylene skeleton becomes a long chain, disposal of the phthalimide group cannot be adjusted, and an effect as a derivative cannot be obtained.

The number of halogen, atoms and average composition of the halogenated zinc phthalocyanine pigment composition can be obtained from X-ray fluorescence spectrometry. According to the X-ray fluorescence spectrometry, the content ratio of each element is obtained from the intensity of the Kα ray of chlorine, bromine, and zinc detected by using ZSX100E (manufactured by Rigaku Corporation) as an analysis apparatus, and a molar ratio of chlorine to bromine when zinc is set to 1 is calculated.

In addition, if the method of measuring an average number of substituents of the halogenated zinc phthalocyanine pigment derivative having a phthalimide skeleton bonded by an alkylene group is described in a simple manner, the halogenated zinc phthalocyanine derivative is mixed with KBr and pressurized to produce a sample for infrared absorption spectrum, the infrared absorption spectrum is measured by FT/IR-6100 (manufactured by JASCO Corporation), and an average number of substituents is calculated from the ratio of the peak height, of absorption of 1390 $cm^{-1}$ which is characteristic absorption of phthalocyanine to the peak height of absorption of 1770 $cm^{-1}$ or 1720 $cm^{-1}$ which is characteristic absorption of the phthalimide alkyl group. In addition, the halogenated zinc phthalocyanine derivative having a phthalimide skeleton bonded by an alkylene group is directly subjected to mass spectrometric analysis, 1 substitution product to 4 substitution products are quantitatively analyzed, and the result thereof is averaged to be able to calculate the average number of substituents.

The aforementioned green pigment composition including the halogenated zinc phthalocyanine pigment and the halogenated zinc phthalocyanine pigment derivative having a phthalimide skeleton bonded by an alkylene group is dried and pulverized within a pulverizer such as an attritor, a ball mill, a vibrating mill, and a vibrating ball mill if necessary, and subsequently formed into a pigment by a solvent salt milling method or solvent boiling method. Due to this, a pigment having excellent dispersibility or a coloring power and exhibiting a green color with high brightness can be obtained before pigment formation.

The ratio of the halogenated zinc phthalocyanine pigment and the halogenated zinc phthalocyanine pigment derivative having a phthalimide skeleton bonded by an alkylene group is not particularly limited, and the halogenated zinc phthalocyanine pigment derivative having a phthalimide skeleton bonded by an alkylene group is preferably contained 0.1 to 10 parts per 100 parts of the halogenated zinc phthalocyanine pigment in terms of a mass, since high contrast can be obtained as luminance and a coloring power are maintained as they are, when the pigment composition is used for a color filter.

A method of forming the green pigment composition including the halogenated zinc phthalocyanine pigment and the halogenated zinc phthalocyanine pigment derivative having a phthalimide skeleton bonded by an alkylene group into a pigment is not particularly limited, and for example, the green pigment composition including the halogenated zinc phthalocyanine pigment and the halogenated zinc phthalocyanine pigment derivative having a phthalimide skeleton bonded by an alkylene group before pigment formation is dispersed in a dispersion medium and at the same time, may be subjected to pigment formation. However, a solvent salt milling treatment is preferably adopted rather than a solvent treatment, in which the green pigment composition including the halogenated zinc phthalocyanine pigment and the halogenated zinc phthalocyanine pigment derivative having a phthalimide skeleton bonded by an alkylene group is heated and stirred in a large amount of an organic solvent, from a viewpoint of being able to suppress crystal growth easily and obtain a pigment particle having a large specific surface area.

This solvent salt milling means kneading and pulverizing an organic solvent, inorganic salts, and the green pigment composition including the halogenated zinc phthalocyanine pigment and the halogenated zinc phthalocyanine pigment derivative having a phthalimide skeleton bonded by an alkylene group, which has been pulverized immediately after synthesis or thereafter and has not been subjected to pigment formation. At this time, as the kneading machine, for example, a kneader, a mix muller, a trimix, a twin-screw extruder, or the like can be used.

As the inorganic salts, water-soluble inorganic salts can be preferably used and for example, inorganic salts such as sodium chloride, potassium chloride, and sodium sulfate can be preferably used. In addition, inorganic salts having an average particle diameter of 0.5 to 50 μm are more preferably used. Such inorganic salts can be more easily obtained by finely pulverizing normal inorganic salts.

In the present invention, a green pigment composition including the halogenated zinc phthalocyanine pigment derivative having a phthalimide skeleton bonded by an alkylene group and the halogenated zinc phthalocyanine pigment whose average particle diameter of the primary particle is 0.01 to 0.10 μm is preferably used for a color filter. In obtaining the aforementioned preferred halogenated zinc phthalocyanine pigment of the present invention, the use amount of the inorganic salts with respect to the use amount of the coarse pigment in the solvent salt milling is preferably set to high. That is, the use amount of the inorganic salts is preferably 5 to 20 parts by mass and more preferably 7 to 15 parts by mass with respect to 1 part by mass of the coarse pigment.

As the organic solvent, an organic solvent which can suppress the crystal growth is preferably used, and as this kind of the organic solvent, a water-soluble organic solvent can be preferably used. For example, diethylene glycol, glycerin, ethylene glycol, propylene glycol, liquid polyethylene glycol, liquid polypropylene glycol, 2-(methoxymethoxy)ethanol, 2-butoxyethanol, 2-(isopentyloxy)ethanol, 2-(hexyloxy)ethanol, diethylene glycol monomethyl ether, diethylene glycol monoethyl ether, diethylene glycol monobutyl ether, triethylene glycol, triethylene glycol monomethyl ether, 1-methoxy-2-propanol, 1-ethoxy-2-propanol, dipropylene glycol, dipropylene glycol monomethyl ether, dipropylene glycol monomethyl ether, dipropylene glycol, or the like can be used. The use amount of the water-soluble organic solvent is not particularly limited, and is preferably 0.01 to 5 parts by mass with respect to 1 part by mass of the coarse pigment.

In a case where the green pigment composition including the halogenated zinc phthalocyanine pigment and the halogenated zinc phthalocyanine pigment derivative having a phthalimide skeleton bonded by an alkylene group is manufactured by solvent salt milling, the halogenated zinc phthalocyanine pigment, and the halogenated zinc phthalocyanine pigment derivative having phthalocyanine and a phthalimide skeleton bonded by an alkylene group are respectively subjected to solvent salt milling and may be combined later, or the halogenated zinc phthalocyanine pigment and the halogenated zinc phthalocyanine pigment derivative having a phthalimide skeleton bonded by an alkylene group are mixed with each other at the same time within a machine and may be subjected to solvent salt milling. In the evaluation of optical properties of a color filter, both methods do not have any difference from a viewpoint of being able to suppress deterioration in optical properties according to thermal history after a color filter is produced. Addition of the halogenated zinc phthalocyanine pigment derivative having a phthalimide skeleton bonded by an alkylene group can achieve enhancement of viscosity of a resist ink for color filters and enhancement of dispersion stability.

In the halogenated zinc phthalocyanine pigment derivative having a phthalimide skeleton bonded by an alkylene group, any conventionally known derivatives can be used as the phthalocyanine derivative, but a phthalocyanine pigment derivative represented by the following General Formula (1) or (2) is preferable. In addition, this phthalocyanine derivative is preferably a phthalocyanine derivative corresponding to the halogenated zinc phthalocyanine pigment or zinc phthalocyanine, which is a raw material thereof, but even in a case where the phthalocyanine derivative is used in combination, a small amount is used. Thus, a halogenated copper phthalocyanine derivative or a copper phthalocyanine derivative can be used.

$P—(Y)n$     General Formula (1)

$P-(A-Z)n$   General Formula (2)

In the formulas, P represents a residue in which hydrogens in the number of n have been removed from unsubstituted or halogenated phthalocyanine ring which optionally have a central metal. Y represents a primary to tertiary amino group, a carboxylic acid group, a sulfonic acid group, or salts of the above and a base or a metal. A represents a divalent linking group, Z represents a residue in which at least one hydrogen on a nitrogen atom of the primary to secondary amino group has been removed, or a residue in which at least one hydrogen on a heterocyclic nitrogen atom including nitrogen has been removed, n represents 1 to 4.

Examples of the central metal include Zn and examples of the primary to secondary amino group include a monomethyl amino group, a dimethyl amino group, and a diethyl amino group. In addition, examples of the base or metal forming salts with the carboxylic acid group or the sulfonic acid group include organic bases such as ammonia, dimethylamine, diethylamine, and trimethylamine, and metals such as potassium, sodium, calcium, strontium, aluminum. Examples of the divalent linking group for A include divalent linking groups such as an alkylene group having 1 to 3 carbon atoms, $—CO_2—$, $—SO_2—$, and $—SO_2NH(CH_2)m-$. Examples of the Z include a phthalimide group, a monoalkyl amino group, and a dialkyl amino group.

The amount of the phthalocyanine derivative which can be contained in the halogenated zinc phthalocyanine pigment at the time of manufacturing the halogenated zinc phthalocyanine pigment and/or solvent salt milling is normally 0.01 to 0.3 parts by mass per 1 part by mass of the halogenated zinc phthalocyanine pigment. In a case where the phthalocyanine derivative is used at the time of manufacturing the halogenated zinc phthalocyanine pigment and/or solvent salt, milling, the total amount of the coarse pigment and the phthalocyanine derivative is regarded as the use amount of the coarse pigment and the use amount of the inorganic salts or the like is selected from the aforementioned range.

In controlling of particles of the pigment, in order to suppress the crystal growth at the time of solvent salt milling and achieve a small particle diameter which is suitable to be used for color filters, the temperature is preferably 30° C. to 150° C. and more preferably 80° C. to 100° C. In the same manner, the time for solvent salt milling is preferably 5 hours to 20 hours and more preferably 8 to 18 hours.

In this way, a mixture including the halogenated sine phthalocyanine pigment composition whose average particle diameter of the primary particle is 0.01 to 0.10 μm, the inorganic salts, and the organic solvent as a major component, is obtained, but the organic solvent and the inorganic salts are removed from this mixture and, if necessary, a solid content including the halogenated zinc phthalocyanine pigment composition as a major component is rinsed, filtered, dried, and pulverized. Thus, a powder of the halogenated zinc phthalocyanine pigment composition can be obtained.

For rinsing, any of water rinsing or warm water rinsing can be adopted. The rinsing may be repeated within the number of 1 to 5 times. In a case of the mixture in which water-soluble inorganic salts and water-soluble organic solvents are used, it is possible to remove the organic solvent and the inorganic salts easily by water rinsing. If necessary, acid rinsing, alkali rinsing, or organic solvent rinsing may be conducted so as not to change the crystal state.

For the drying after filtering and rinsing described above, a batch-wise or a continuous drying is exemplified, which removes water and/or solvent from the pigment by heating at a temperature of 80° C. to 120° C. by means of a heating source provided in a drier. Examples of the drier generally include a compartment drier, a band drier, and a spray drier. In particular, the spray drier is preferable because of easy dispersion at the time of producing a paste. Also, pulverization after drying is not an operation for increasing a specific surface area or decreasing an average particle diameter of the primary particle, but for releasing and finely pulverizing the pigment when the pigment becomes a lump shape, for example, a case of drying using a compartment drier or a band drier. Examples of the pulverization include pulverization using a mortar, a hammer mill, a disk mill, a pin mill, and a jet mill. In this way, a dried powder including the green pigment composition of present invention including the halogenated zinc phthalocyanine pigment and the halogenated zinc phthalocyanine pigment derivative having a phthalimide skeleton bonded by an alkylene group as a major component is obtained.

In addition, the green pigment composition of the present invention including the halogenated zinc phthalocyanine pigment and the halogenated zinc phthalocyanine pigment derivative having a phthalimide skeleton bonded by an alkylene group has a weak aggregating force of the primary particle and a property of being easily released, compared to the conventional halogenated copper phthalocyanine pigment. It is possible to observe the primary particle of each pigment configuring an aggregate, which cannot be observed in the conventional pigment, by electron micrograph.

The green pigment composition of the present invention including the halogenated zinc phthalocyanine pigment and the halogenated zinc phthalocyanine pigment derivative having a phthalimide skeleton bonded by an alkylene group can be used for any conventionally known purposes. In particular, since the average particle diameter of the primary particle is 0.01 to 0.10 µm, a pigment aggregation is relatively weak and dispersibility to a synthetic resin to be colored is more improved.

In addition, in a case where the green pigment composition of the present invention including the halogenated zinc phthalocyanine pigment and the halogenated zinc phthalocyanine pigment derivative having a phthalimide skeleton bonded by an alkylene group is used for a color filter green pixel unit, pigment dispersion to the photosensitive composition for color filters is easy, photo-curing sensitivity with respect to a bright line of 365 nm frequently used at the time of curing the photosensitive composition for color filters is not degraded, and film thinning or pattern peeling at the time of development is unlikely to occur, which is preferable. A color filter green pixel unit having both high luminance and high color reproducibility, which have been demanded in recent years, is more simply obtained.

If the primary particle of the green pigment composition of the present invention including the halogenated zinc phthalocyanine pigment and the halogenated zinc phthalocyanine pigment derivative having a phthalimide skeleton bonded by an alkylene group has a vertical and horizontal aspect ratio of 1 to 3, viscosity is enhanced in each field of usage and fluidity is further increased. For obtaining the aspect ratio, first, in the same manner as the case of obtaining the average particle diameter of the primary particle, the particle within a visual field is photographed by a transmission electron microscope or a scanning electron microscope. Then, an average value of the diameter of the longer side (major axis) and the diameter of the shorter side (minor axis) of 50 primary particles configuring an aggregate on a two-dimensional image is obtained and this value is used to calculate the aspect ratio.

Inclusion of the green pigment composition of the present invention including the halogenated zinc phthalocyanine pigment and the halogenated zinc phthalocyanine pigment derivative having a phthalimide skeleton bonded by an alkylene group in at least a green pixel unit of the color filter enables obtainment of the color filter of the present invention.

In the same manner as the conventional halogenated zinc phthalocyanine pigment, the green pigment composition of the present invention including the halogenated zinc phthalocyanine pigment and the halogenated zinc phthalocyanine pigment derivative having a phthalimide skeleton bonded by an alkylene group can be used in combination for mixing with a yellow pigment if necessary, in a case of obtaining a green pixel unit of the color filter.

As described above, in the green pigment composition of the present invention including the halogenated zinc phthalocyanine pigment and the halogenated zinc phthalocyanine pigment derivative having a phthalimide skeleton bonded by an alkylene group, in the same manner as the conventional halogenated zinc phthalocyanine pigment, the wavelength (Tmax) in which transmittance of a spectral transmission spectrum between 380 to 780 nm becomes the maximum is 500 to 520 nm, and a half width of this transmission curve is 110 nm or less, which is abnormally sharp (this wavelength is not affected by a photosensitive resin described below).

The spectral transmission spectrum in the evaluation of the color filter is obtained in conformity of the first type spectrophotometer of Japanese Industrial Standards JIS Z 8722 (Methods of color measurement—Reflecting and transmitting objects) and obtained such that a resin coating film including the pigment composition and formed in a predetermined dried film thickness on a glass substrate is scanning-irradiated with light of a predetermined wavelength region and each transmittance value at each wavelength is plotted. The transmittance of the color filter can be obtained more accurately, for example, by correcting (base line correction or the like) the each transmittance value using the spectral transmission spectrum obtained in the same manner as the coating film formed of only a resin and in the same dried film thickness.

The color filter of the present invention which contains the green pigment composition including the halogenated zinc phthalocyanine pigment and the halogenated zinc phthalocyanine pigment derivative having a phthalimide skeleton bonded by an alkylene group in a green pixel unit can satisfactorily transmit light in the green region of a light source, in a case of using the light source such as white light, F10, or the like. Since the spectral transmission spectrum of the halogenated zinc phthalocyanine pigment composition is sharp, color purity of the green color and the coloring power can be exhibited to the maximum.

Only the green pigment composition of the present invention including the halogenated zinc phthalocyanine pigment and the halogenated zinc phthalocyanine pigment derivative having a phthalimide skeleton bonded by an alkylene group can be used for manufacturing a green pixel unit of the color filter as it is, if necessary, in consideration of economic efficiency, the conventionally known green halogenated copper phthalocyanine or other green halogenated metal phthalocyanine pigments such as a green halogenated dissimilar metal phthalocyanine pigment may be used in combination.

The mass ratio of the green pigment composition of the present invention including the halogenated zinc phthalocyanine pigment and the halogenated zinc phthalocyanine pigment derivative having a phthalimide skeleton bonded by an alkylene group to the conventionally known green halogenated metal phthalocyanine pigment is 100:0 to 80:20 and preferably 100:0 to 90:10.

In addition, in addition to the green pigment, a yellow pigment for mixing the colors in order to exhibit the properties may be used. Examples of the yellow pigment which can be used in combination include yellow organic pigments such as C.I. pigment yellow 83, C.I. pigment yellow 110, C.I. pigment yellow 129, C.I. pigment yellow 138, C.I. pigment yellow 139, C.I. pigment yellow 150, C.I. pigment yellow 180, and C.I. pigment yellow 185. In the combination ratio of the halogenated zinc phthalocyanine pigment composition of the present invention to the yellow pigment, the yellow pigment is 10 to 200 parts by mass per 100 parts by mass of the halogenated zinc phthalocyanine pigment composition.

If the green pigment composition of the present invention including the halogenated zinc phthalocyanine pigment and the halogenated zinc phthalocyanine pigment derivative having a phthalimide skeleton bonded by an alkylene group is used, even in a case where the green pigment composition is used in combination for mixing with a yellow pigment, it is possible to obtain a bright color filter green pixel unit having less turbidity and excellent color purity and a coloring power, compared to the conventional case where two or more different color pigments are mixed for mixing the colors.

For example, in a case where the yellow pigment is used in combination with the halogenated zinc phthalocyanine pigment composition of the present invention, color purity and a coloring power are high and accordingly, a decrease in brightness is even less and transmission quantity of light in a green color region becomes greater, compared to a case where the aforementioned yellow pigment is used in combination with the conventional green pigment such as C.I. pigment green 7 and C.I. pigment green 36.

The green pigment composition of the present invention including the halogenated zinc phthalocyanine pigment and the halogenated zinc phthalocyanine pigment derivative having a phthalimide skeleton bonded by an alkylene group can be used for forming a pattern of a green pixel unit of the color filter according to the conventionally known method. Typically, it is possible to obtain a photosensitive composition for a color filter green pixel unit including the halogenated zinc phthalocyanine pigment composition of the present invention and a photosensitive resin as an essential component.

As a method for manufacturing a color filter, a method which is referred to as photolithography, is exemplified, in which this halogenated zinc phthalocyanine pigment composition is dispersed in a dispersion medium including a photosensitive resin and then applied to a transparent substrate such as a glass according to a spin coat method, a roll coat method, a slit coat method, an ink jet method, or the like, subsequently, a pattern exposure is performed with respect to this coating film using ultraviolet rays via a photomask and then the unexposed area is rinsed by a solvent or the like to obtain a green pattern.

In addition, a pattern of the green pixel unit may be formed according to an electrodeposition method, a transfer method, a micelle electrolytic method, a photovoltaic electrodeposition (PVED) method to manufacture a color filter. In addition, a pattern of the red pixel unit and a pattern of the blue pixel unit can be formed according to the same method using the conventionally known pigment.

For preparing the photosensitive composition for a color filter green pixel unit, for example, the green pigment composition of the present invention including the halogenated zinc phthalocyanine pigment and the halogenated zinc phthalocyanine pigment derivative having a phthalimide skeleton bonded by an alkylene group, the photosensitive resin, a photopolymerization initiator, and an organic solvent for dissolving the resin are mixed with each other as an essential components. As the manufacturing method thereof, a method is general, in which the halogenated zinc phthalocyanine pigment composition, the organic solvent, and a dispersant if necessary, are used to prepare a dispersion liquid and then the photosensitive resin is added thereto to prepare the photosensitive composition for a color filter green pixel unit.

Here, the green pigment composition including the halogenated zinc phthalocyanine pigment and the halogenated zinc phthalocyanine pigment derivative having a phthalimide skeleton bonded by an alkylene group and, if necessary, the yellow pigment can be used.

Examples of the dispersant to be used according to the necessity include DISPERBYK (DISPERBYK, registered trademark) 130, DISPERBYK 161, DISPERBYK 162, DISPERBYK 163, DISPERBYK 170, DISPERBYK LPN-6919, and DISPERBYK LPN-21116 of BYK Additives & Instruments, and Efka 46, and Efka 47 of Efka Chemicals. A leveling agent, a coupling agent, a cationic surfactant, or the like can be used in combination.

Examples of the organic solvent include an aromatic solvent such as toluene, xylene, and methoxybenzene, an acetic acid ester-based solvent such as ethyl acetate, butyl acetate, propylene glycol monomethyl ether acetate, and propylene glycol monoethyl ether acetate, a propionate-based solvent such as ethoxyethyl propionate, an alcohol-based solvent such as methanol and ethanol, an ether-based solvent such as butyl cellosolve, propylene glycol monomethyl ether, diethylene glycol ethyl ether, and diethylene glycol dimethyl ether, a ketone-based solvent such as methyl ethyl ketone, methyl isobutyl ketone, and cyclohexanone, an aliphatic hydrocarbon-based solvent such as hexane, a nitrogen compound-based solvent such as N,N-dimethyl formamide, γ-butyrolactam, N-methyl-2-pyrrolidone, aniline, and pyridine, a lactone-based solvent such as γ-butyrolactone, and carbamaic acid ester such as a mixture of methyl carbamate and ethyl carbamate (48:52).

300 to 1000 parts by mass of the organic solvent, and, if necessary, 0 to 100 parts by mass of the dispersant and/or 0 to 20 parts by mass of the phthalocyanine derivative per 100 parts by mass of the halogenated zinc phthalocyanine pigment composition of the present invention are stirred and dispersed so as to be uniform and a dispersion liquid can be obtained. Subsequently, 3 to 20 parts by mass of the photosensitive resin per 1 part by mass of the halogenated zinc phthalocyanine pigment composition, 0.05 to 3 parts by mass of the photopolymerization initiator per 1 part by mass of the photosensitive resin, and, if necessary, the organic solvent, are added to this dispersion liquid and stirred and dispersed so as to be uniform and the photosensitive composition for a color filter green pixel unit can be obtained.

Examples of the photosensitive resin which can be used at this time include a thermoplastic resin such as a urethane-based resin, an acrylic resin, a polyamic acid-based resin, a polyimide-based resin, a styrene maleic acid-based resin, and a styrene maleic anhydride-based resin; and a photopolymerizable monomer including a bifunctional monomer such as 1,6-hexane diol diacrylate, ethylene glycol diacrylate, neopentyl glycol diacrylate, triethylene glycol diacrylate, bis(acryloxyethoxy)bisphenol A, and 3-methyl pentane diol diacrylate, and a polyfunctional monomer such as trimethylol propane triacrylate, pentaerythritol triacrylate, tris(2-hydroxyethyl)isocyanate, dipentaerythritol hexaacrylate, and dipentaerythritol pentaacrylate.

Examples of the photopolymerizable initiator include acetophenone, benzophenone, benzyl dimethylketal, benzoyl peroxide, 2-chlorothioxanthone, 1,3-bis(4'-azide benzal)-2-propane, 1,3-bis(4'-azido benzal)-2-propane-2'-sulfonic acid, and 4,4'-diazido stilbene-2,2'-disulfonic acid.

A pattern exposure is performed with respect to the photosensitive composition for a color filter green pixel unit prepared in this way using ultraviolet rays via a photomask, and then the unexposed area is rinsed by an organic solvent or alkaline water to obtain a color filter.

The halogenated zinc phthalocyanine pigment composition of the present invention exhibits a bluish green color, which is a bright green color having a high coloring power, high purity, and high contrast. Accordingly, in addition to the aforementioned color filter, the halogenated zinc phthalocyanine pigment composition of the present invention can be applied for coloring of a coating material, plastics, printing ink, rubber, leather, textile printing, an electronic toner, jet ink, and heat transfer ink.

EXAMPLES

Next, the present invention will be specifically described using Examples. Hereinafter, "%" means "% by mass" and "part" means "part by mass" unless otherwise indicated.

Preparation Example 1

90 g of sulfuryl chloride (a reagent of Wako Pure Chemical industries, Ltd.), 105 g of aluminum chloride (a reagent of Kanto Chemical Co., Inc.), 14 g of sodium chloride (a reagent of Tokyo Chemical Industry Co., Ltd.), 27 g of zinc phthalocyanine manufactured by DIG Corporation, and 45 g of bromine (a reagent of Wako Pure Chemical industries, Ltd.) were put into a 300 ml flask. The temperature of the contents was increased up to 130° C., the contents were put into water, and then the resultant was filtered to obtain halogenated zinc phthalocyanine (A). It was confirmed that an average halogenation rate of bromine is 8.6 and an average halogenation rate of chlorine is 2.5 by X-ray fluorescence spectrometry of the halogenated zinc phthalocyanine (A).

Preparation Example 2

Halogenated zinc phthalocyanine (B) was obtained in the same manner as Preparation Example 1 except that the used amount of bromine was changed to 30 g. It was confirmed that an average halogenation rate of bromine is 6.9 and an average halogenation rate of chlorine is 3.1 by X-ray fluorescence spectrometry of the halogenated zinc phthalocyanine (B).

Preparation Example 3

Halogenated zinc phthalocyanine (C) was obtained in the same manner as Preparation Example 1 except that the used amount of bromine was changed to 60 g. It was confirmed that an average halogenation rate of bromine is 10.2 and an average halogenation rate of chlorine is 2.5 by X-ray fluorescence spectrometry of the halogenated zinc phthalocyanine (C).

Preparation Example 4

3 g of the halogenated zinc phthalocyanine (A) produced in Preparation Example 1 was dissolved in 27 g of a sulfuric acid (a reagent of Wako Pure Chemical industries, Ltd.), and 5 g of phthalimide (a reagent of Kanto Chemical Co., Inc.) and 2 g of paraformaldehyde (a reagent of Kanto Chemical Co., Inc.) were added thereto to undergo a reaction at a temperature of 80° C. Thereafter, the contents were put into water, and the resultant was filtered and rinsed to obtain phthalimide methylated halogenated zinc phthalocyanine (D). By means of infrared absorption spectrum of the product, it was confirmed that an average number of substituents of the phthalimide methyl group is 0.6.

Preparation Example 5

Phthalimide methylated halogenated zinc phthalocyanine (E) was obtained in the same manner as Preparation Example 4 except that the halogenated zinc phthalocyanine (B) produced in Preparation Example 2 was used. By means of infrared absorption spectrum of the product, it was confirmed that an average number of substituents of the phthalimide methyl group is 1.0.

Preparation Example 6

20 g of the halogenated zinc phthalocyanine (C), 1 g of the phthalimide methylated halogenated zinc phthalocyanine (D), 140 g of pulverized sodium chloride, and 32 g of diethylene glycol were put into a double-arm kneader and kneaded at a temperature of 100° C. for 6 hours. After kneading, the kneaded material was put into 2 kg of warm water having a temperature of 80° C., and the resultant was stirred for 1 hour, filtered, rinsed with warm water, dried, and pulverized to obtain a green pigment composition (F).

Preparation Example 7

A green pigment composition (G) was obtained in the same manner except that the phthalimide methylated halogenated zinc phthalocyanine (D) in Preparation Example 6 was changed to phthalimide methylated halogenated zinc phthalocyanine (E).

Preparation Example 8

A green pigment, composition (H) was obtained in the same manner except that the phthalimide methylated halogenated zinc phthalocyanine (D) in Preparation Example 6 was not used.

Example 1

2.48 g of the green pigment composition (F), 1.24 g of a dispersant BYK-LPN6919 manufactured by BYK Additives & Instruments, 1.86 g of UNIDIC ZL-295 manufactured by DIC Corporation, and 10.92 g of propylene glycol monomethyl ether acetate were dispersed for 2 hours in a paint shaker manufactured by TOYO SEIKI Co., Ltd. using 0.3 to 0.4 mm of zircone beads to obtain a green coloring composition (a). 4.0 g of the green coloring composition (a), 0.98 g of UNIDIC ZL-295, and 0.22 g of propylene glycol monomethyl ether acetate were added and mixed in a paint, shaker to obtain a green color composition for evaluation (1). This green color composition for evaluation (1) was spin coated on a soda glass and dried at a temperature of 90° C. for 3 minutes to obtain a glass substrate for evaluation. The obtained glass substrate for evaluation was heated at a temperature of 230° C. for 1 hour to cure a coating film, and then a contrast ratio was measured using a contrast, tester (manufactured by TSUBOSAKA ELECTRIC CO., LTD., CT-1). The number of spin coating was adjusted such that chromaticity of the cured coating film becomes y=0.430 with a light source C to produce a glass substrate for evaluation.

Comparative Example 1

A green color composition for evaluation (2) and a glass substrate for evaluation were produced in the same manner as Example 1 except that the green pigment composition (F) in Example 1 was changed to the green pigment composition (G) produced in Preparation Example 7.

Comparative Example 2

A green color composition for evaluation (3) and a glass substrate for evaluation were produced in the same manner as Example 1 except that the green pigment composition (F) in Example 1 was changed to the green pigment composition (H) produced in Preparation Example 8.

TABLE 1

|  | Green Pigment Composition | Contrast ratio |
|---|---|---|
| Example 1 | F | 112% |
| Comparative Example 1 | G | 98% |
| Comparative Example 2 | H | 100% |

The results of Example 1 and Comparative Examples 1 and 2 are shown in Table 1.

From Table 1, it was understood that in the green pigment composition including the halogenated zinc phthalocyanine pigment and the halogenated zinc phthalocyanine pigment derivative having a phthalimide skeleton bonded by an alkylene group, the contrast ratio was enhanced by 10% or more, compared to a case where a derivative including 6.9 bromine atoms and 3.1 chlorine atoms, which were out of the range of the halogenation rate according to the present application, was used, or a case where the derivative was not used.

Example 2

16.5 g of the pigment yellow 123 (manufactured by BASF SE., Irgazin Yellow L0800), 3.85 g of DISPERBYK-161 (manufactured by BYK Additives & Instruments), and 11.00 g of propylene glycol monomethyl ether acetate were dispersed in a paint shaker manufactured by TGYO SEIKI Co., Ltd. for 2 hours using 0.3 to 0.4 mm of zircone beads to obtain a coloring composition (b). 4.0 g of the coloring composition (b), 0.98 g of UNIDIC ZL-295 manufactured by DIC Corporation, and 0.22 g of propylene glycol monomethyl ether acetate were added and mixed in a paint shaker to obtain a composition for mixing colors (4).

Example 3

The composition for mixing colors (4) and the composition for evaluation (1) produced in Example 1 were mixed to each other, and a film was formed therefrom and dried. The obtained glass plate was heated at a temperature of 230° C. for 1 hour to produce a coating film showing chromaticity of (x,y)=(0.265,0.690) with a light source C. Luminance of this coating film was measured using CM-3500d manufactured by KONICA MINOLTA, INC. and the film thickness was measured by Real Color Confocal Microscope OPTELICS C130 manufactured by Lasertec Corporation.

Comparative Example 3

The luminance and the film thickness were measured in the same manner as Example 3 except that the composition for evaluation (1) in Example 3 was changed to the composition for evaluation (3).

TABLE 2

|  | Luminance | Film thickness |
|---|---|---|
| Example 3 | 21.55 | 100% |
| Comparative Example 3 | 21.53 | 100% |

The results of luminance and film thickness of each coating film in Example 3 and Comparative Example 3 are shown in Table 2.

From Table 2, it was understood that in the green pigment composition including the halogenated zinc phthalocyanine pigment and the halogenated zinc phthalocyanine pigment derivative having a phthalimide skeleton bonded by an alkylene group, the luminance was not decreased and the film thickness was not increased compared to a case where the derivative of the present invention was not added.

The invention claimed is:

1. A green pigment composition for color filters comprising:
from 0.1 to 10 parts of a pigment derivative represented by General Formula (1) per 100 parts of a halogenated zinc phthalocyanine pigment, in terms of a mass:

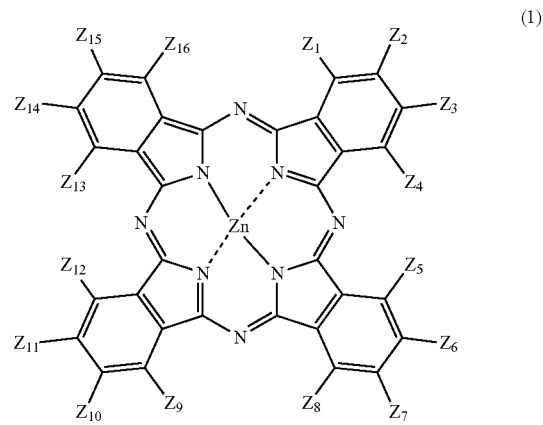

(1)

wherein $Z_1$ to $Z_{16}$ each independently represent a bromine atom, a chlorine atom, a hydrogen atom, or a functional group having a phthalimide skeleton bonded by an alkylene group having 1 to 3 carbon atoms, an average number of bromine atoms in one molecule is 8 to 12, an average number of chlorine atoms is 2 to 5, an average number of substituents of the functional group having a phthalimide skeleton bonded by an alkylene group having 1 to 3 carbon atoms is from 0.1 to 3, and the remainder is hydrogen atoms.

2. The green pigment composition for color filters according to claim 1,
wherein the halogenated zinc phthalocyanine pigment has 10 to 14 halogen atoms on average in one molecule, and among these, the number of bromine atoms is from 8 to 12 on average, and the number of chlorine atoms is from 2 to 5 on average.

3. The green pigment composition for color filters according to claim 1, further comprising:
a yellow pigment.

4. A color filter comprising:
the pigment composition for color filters according to claim 1.

5. A method for manufacturing the pigment composition for color filters according to claim 1, which comprises solvent salt milling.

* * * * *